United States Patent
Ridgeway et al.

(10) Patent No.: US 7,571,370 B2
(45) Date of Patent: Aug. 4, 2009

(54) CONFIGURABLE, FAST, 32-BIT CRC GENERATOR FOR 1-BYTE TO 16-BYTES VARIABLE WIDTH INPUT DATA

(75) Inventors: Jeremy Ridgeway, Santa Cruz, CA (US); Suparna Behera, Cupertino, CA (US); Ravindra Viswanath, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 1129 days.

(21) Appl. No.: 10/601,175

(22) Filed: Jun. 19, 2003

(65) Prior Publication Data

US 2005/0005224 A1    Jan. 6, 2005

(51) Int. Cl.
*H03M 13/00*  (2006.01)
(52) U.S. Cl. ............................ 714/758; 382/296; 381/22
(58) Field of Classification Search .................. 714/758
See application file for complete search history.

(56) References Cited

U.S. PATENT DOCUMENTS

| | | | |
|---|---|---|---|
| 5,361,334 A * | 11/1994 | Cawley | 709/243 |
| 5,734,826 A * | 3/1998 | Olnowich et al. | 709/238 |
| 6,192,498 B1 | 2/2001 | Arato | 714/781 |
| 6,351,142 B1 * | 2/2002 | Abbott | 326/39 |
| 6,487,686 B1 * | 11/2002 | Yamazaki et al. | 714/703 |
| 6,560,742 B1 | 5/2003 | Dubey et al. | 714/757 |
| 6,701,478 B1 * | 3/2004 | Yang et al. | 714/757 |

OTHER PUBLICATIONS

Parallel Cyclic Redundancy Check (CRC) for HOTLink™; Cypress Semiconductor Corporation; Mar. 11, 1999.
CRC Tool, Computing CRC in Parallel for Ethernet; Adrian Simionescu, Design Engineer.

* cited by examiner

*Primary Examiner*—Esaw T Abraham
*Assistant Examiner*—Enam Ahmed
(74) *Attorney, Agent, or Firm*—Suiter Swantz pc llo

(57) ABSTRACT

A method and circuit for performing CRC calculations permits variable width data input. Preferably, multiple CRC calculations are performed in parallel, each CRC calculation involving a different number of data bits from the data word and terminating within one clock cycle. The CRC polynomial is preferably incorporated into the hardware for each CRC calculation.

17 Claims, 4 Drawing Sheets

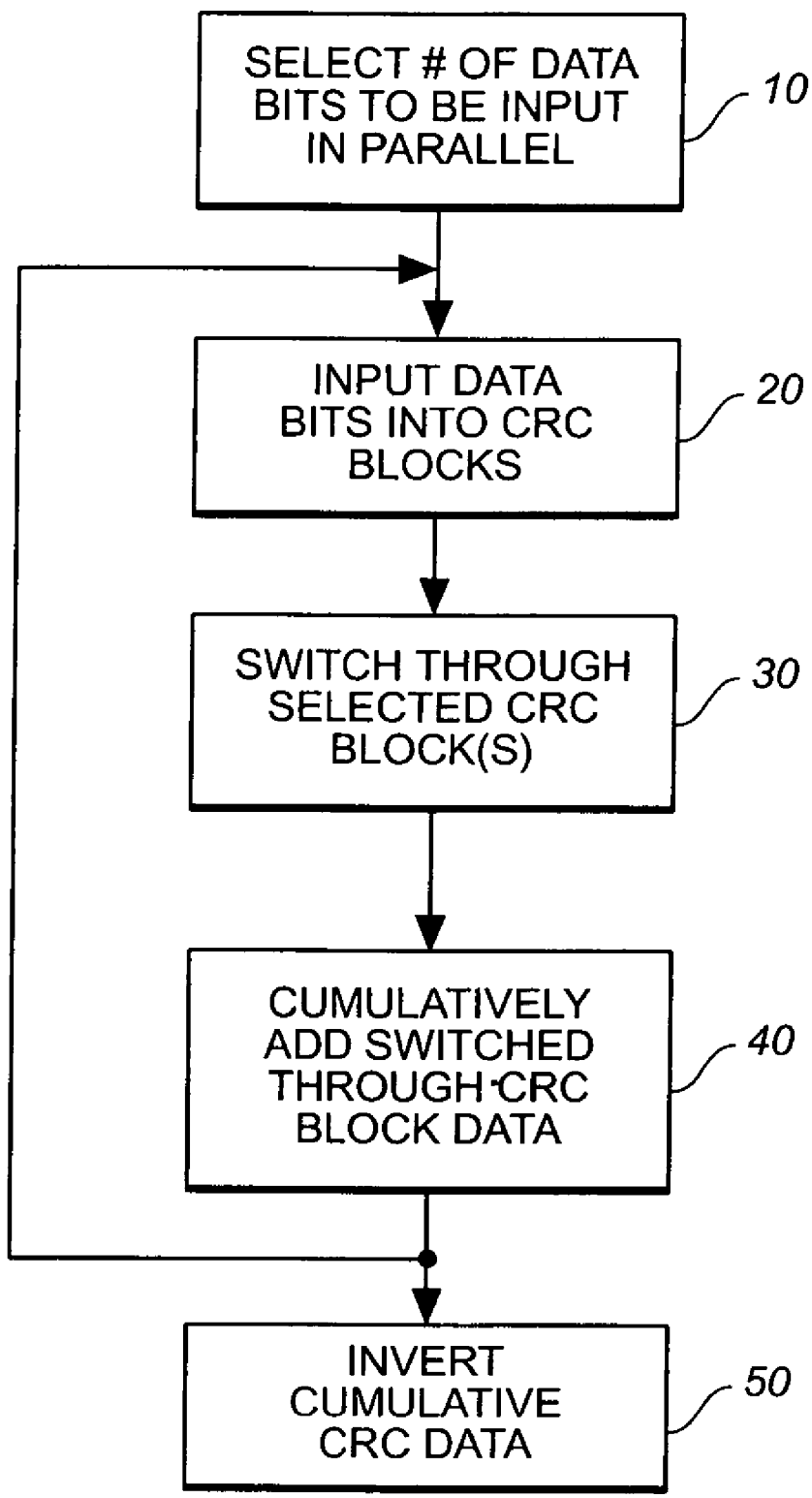
FIG._1

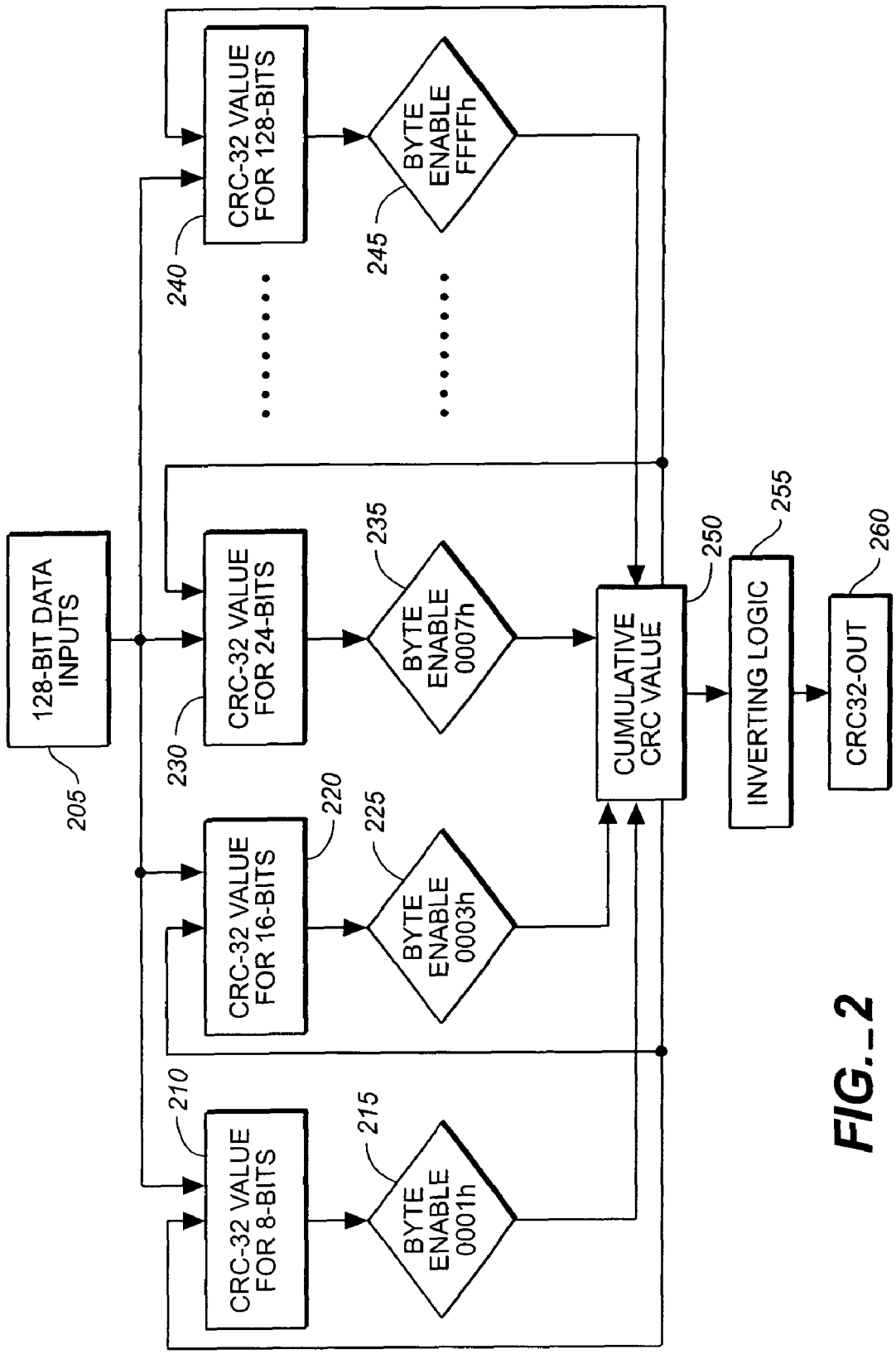
FIG._2

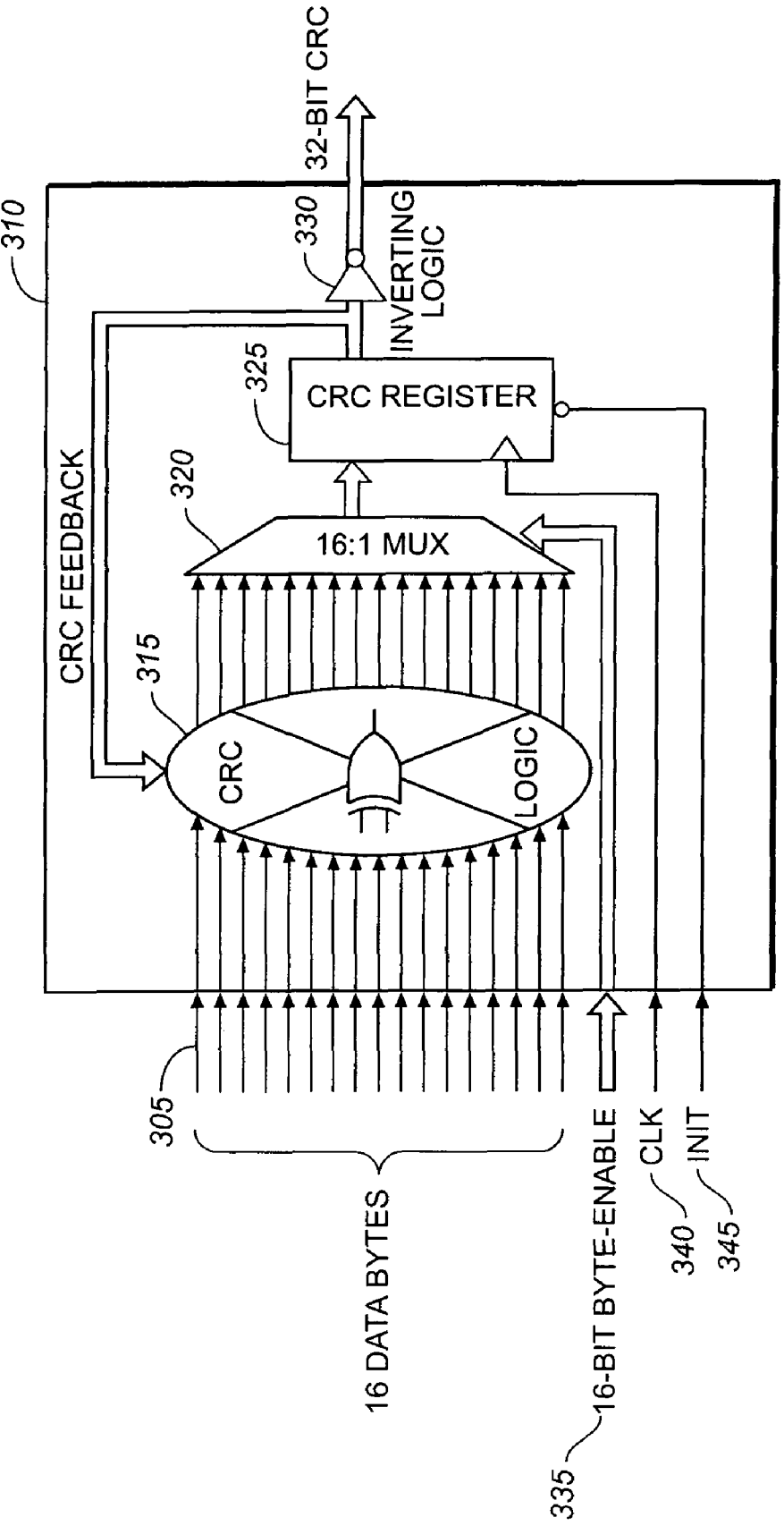
FIG._3

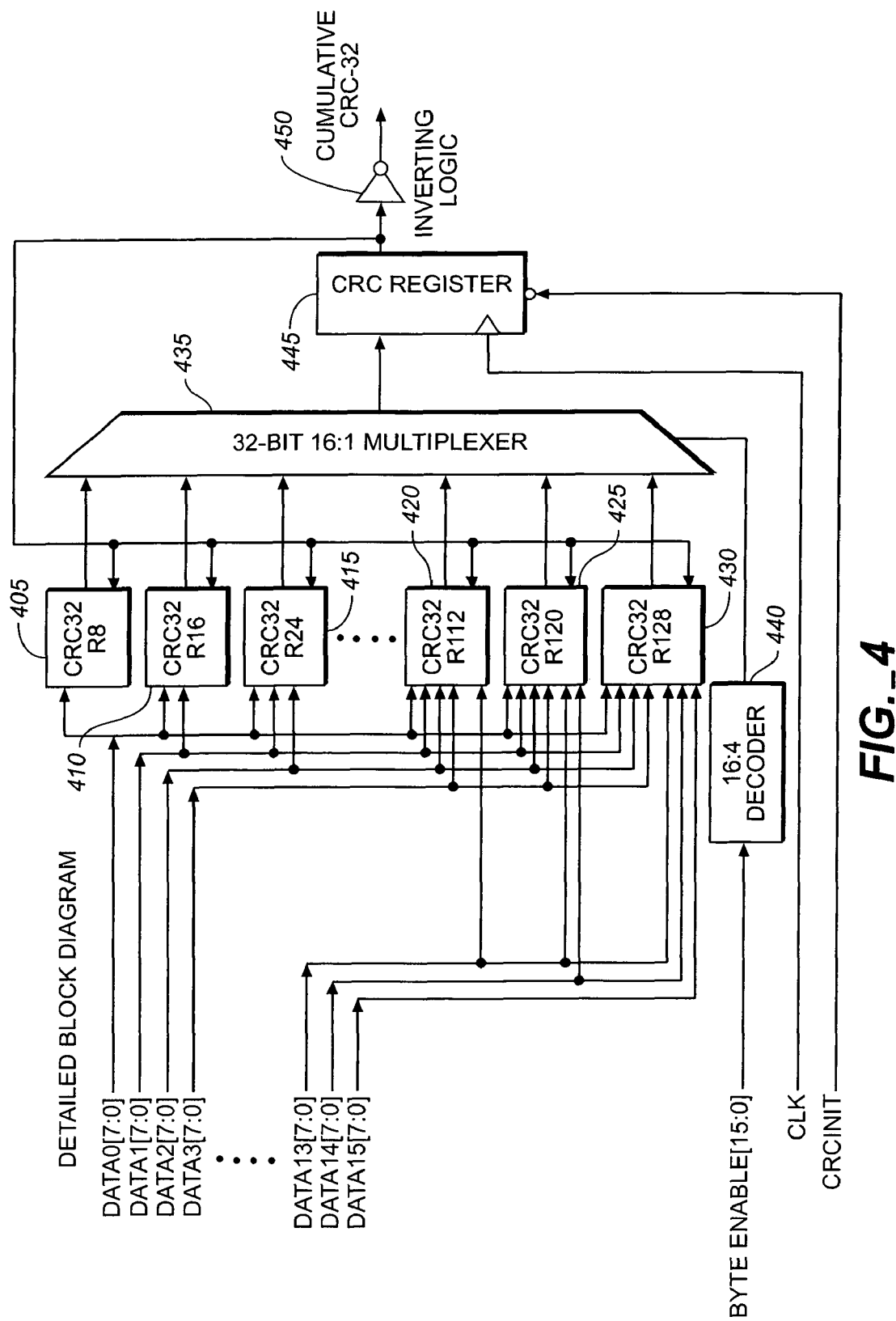
FIG._4

US 7,571,370 B2

CONFIGURABLE, FAST, 32-BIT CRC GENERATOR FOR 1-BYTE TO 16-BYTES VARIABLE WIDTH INPUT DATA

FIELD OF THE INVENTION

The present invention generally relates to the field of error correction code, and particularly to a method and circuit for performing cyclic redundancy checks.

BACKGROUND OF THE INVENTION

As processing speeds in data communications increase, there is a need to perform data integrity calculations as rapidly as possible. The cyclic redundancy check method uses a polynomial to divide into a data word to generate a checksum that is used to measure data integrity. Cyclic redundancy checking (CRC) is performed to ensure data integrity in a data communications system. For environments having multiple data communications formats, different sized data words may need to be processed.

Therefore, it would be desirable to provide a multibit CRC generator that offers high speed and flexibility.

SUMMARY OF THE INVENTION

Accordingly, the present invention is directed to a multibit CRC generator that performs a CRC calculation in a short span of time; preferably, within one clock cycle.

In a first aspect of the present invention, a circuit performs n-bit cyclic redundancy check (CRC) calculations. The circuit has a plurality of CRC calculation blocks. Each of the plurality of CRC calculation blocks performs a CRC calculation to yield a value of an n-bit CRC result. The circuit also includes a switch for selectively passing one of the CRC calculation values and a CRC register for latching the one of the CRC calculation values selectively passed by the switch. The value n may be 32, 16, 8, or number.

In a second aspect of the present invention, a method for calculating a cyclic redundancy check (CRC) value with a variable width data input comprises the steps of inputting a variable width data word, calculating a first CRC value using the variable width data word, and calculating a second CRC value using the variable width data word. The first and second CRC value calculations occur in parallel.

The present invention offers several advantages. The cumulative CRC is available from the cumulative CRC register when required and is updated every clock cycle because multiple CRC block calculations are performed in parallel. Certain expressions that may never occur may be removed to reduce gate counts without affecting the performance of the CRC generator. The CRC determined by the CRC polynomial is calculated for 1 byte, 2 bytes, 3 bytes, and so forth to, 16 bytes every clock cycle from the input data bits and/or the cumulative CRC register. An internal initialization process for the CRC registers may be initiated while a cumulative CRC register supplies a calculated CRC from the previous clock cycle.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 illustrates a flowchart of the general method of the present invention;

FIG. 2 illustrates a functional block diagram of an embodiment of the method of the present invention;

FIG. 3 illustrates a basic functional structure of an embodiment of a circuit in the present invention; and FIG. 4 illustrates a more detailed view of the circuit of FIG. 3.

DETAILED DESCRIPTION OF THE INVENTION

Reference will now be made in detail to the presently preferred embodiments of the invention, examples of which are illustrated in the accompanying drawings.

The present invention relates to a method, system, and circuitry for performing cyclic redundancy check (CRC) operations on variable length data; especially, to a configurable fast 32-bit CRC generator for 1-byte to 16-bytes variable width input data. Each CRC operation is preferably performed within one clock cycle. Preferably, the CRC calculation is performed completely by hardware. The data may vary in size from eight bits to 128 bits in eight bit increments. In an embodiment, the 32-bit CRC generator/checker has a 16 byte input data width in which 16 byte enable bits are provided. The byte enable bits may each enable a CRC calculation block that inputs a single data input byte or may each enable a CRC calculation block that inputs multiple data input bytes. Preferably, the byte enable bites enable CRC calculation blocks that have a varying number of data input bytes; for instance, one CRC calculation block has one data byte input, another CRC calculation block has two data bytes as input, and so forth such that a sixteenth CRC calculation block has sixteen data byte inputs. The CRC value is fed back to the CRC calculator. The CRC output may be stored by a latch and inverted.

FIG. 1 illustrates a flow chart of a method of the present invention. A variable width data word is input (10) in parallel. In an embodiment, the data word may be made parallel from a serial transmission format through use of a linear feedback shift register or other circuitry. The width of the data word may be determined by command bits appended to the word. Alternatively, enable signals may be used to determine a particular CRC processing algorithm to activate. Preferably, enable signals are used to select one of several CRC calculation blocks to provide a CRC value (20,30). In each CRC calculation block, the same CRC polynomial is preferably used in each CRC calculation block. Preferably, the CRC polynomial is a divisor for each data input word that may additionally be left shifted and complemented for each operation. Various arithmetic operations, such as addition, subtraction, and multiplication, and various Boolean operations, such as AND, OR, NOT, and exclusive-OR, may be performed alone or in combination. The selected CRC block's data may then be passed on for further processing, including latching (40). The selected CRC block data may be fed back to one or more of the several CRC calculation blocks (40) and, also, inverted to provide an output (50).

FIG. 2 illustrates a flow diagram of the preferred embodiment of the CRC generator. A 128 bit data input is shown (205). However, the present invention may have a different number of data input bits, such as 256, 32, 16, or another number. At this stage of processing, the data input is transmitted in parallel. A 32-bit CRC value is calculated for various sized data words in parallel processing blocks 210, 220, 230, 240. The calculated CRC value may have a different number of bits, such as 128, 24, or 16. Only one of the parallel processing blocks is selected through a byte enable signal 215, 225, 235, 245. This value may be latched by a register 250, added in an accumulator, or otherwise further processed. The CRC value may be inverted by inverting logic 255 and stored or buffered through a latch, register, or buffer 260. An internal initialization process for initializing the CRC calculation blocks may be performed simultaneously while output is read from the cumulative CRC register.

FIG. 3 illustrates a dynamically configurable CRC generator/checker high-level block diagram. Here, sixteen data bytes 305 are input to the CRC logic 315. The CRC logic may be implemented as an exclusive OR array and/or may include a read only memory for tabular look-ups. The read only memory may be an erasable programmable read only memory (EPROM). The CRC logic may be implemented through a field programmable gate array or complex programmable logic device. Certain expressions that never occur for any input data word may be removed from the logic so as to reduce gate counts without affecting the performance of the CRC generator. Aside from the data byte input, the CRC logic 315 is preferably supplied with CRC feedback from the CRC register 325. The output of the CRC logic 315 is preferably switched through a multiplexer 320 such that only one of a plurality of CRC logic values is passed on to the CRC register 325. The selection of the CRC logic value may be determined by a byte enable word, such as a 16-bit word 335. A clock 340 controls the timing of the CRC register 325. The CRC register 325 may be initialized 345. The CRC logic value may be inverted by inverting logic 330 that provides a CRC logic output.

FIG. 4 illustrates an embodiment having a more detailed view of the block diagram corresponding to FIG. 3. In this embodiment, there are sixteen CRC calculation blocks 405, 410, 415, 420, 425, 430. Each CRC calculation may be implemented so as to have a unique number of data bit inputs. As illustrated, CRC calculation block 405 receives data word 0 as input, whereas CRC calculation block 410 receives data word 0 and data word 1 as inputs. Each CRC32Rn block is a parallel CRC-32 calculation block for n number of bits. For example, CRC32R8 calculates parallel CRC32 value for 8 bits (1 byte) and CRC32R16 calculates parallel CRC32 value for 16 bits (2 bytes). The parallel CRC32 blocks, apart from the data inputs are also fed back with the calculated CRC32 value. Other arrangements are contemplated by the present invention. A 32 bit 16:1 multiplexer 435 selects one of the CRC calculation block's to switch through the CRC value to the CRC register 445. The positive edge of the clock latches the cumulative CRC32 value to the CRC32 register. CRCInit initializes the CRC checker/generator—an indication to start the calculation for a new stream of data. The new stream of data may correspond to a data frame, such as an Ethernet frame. The selection of the CRC calculation may be accomplished through a 16:4 decoder. The 16:4 decoder decodes the 16-bit byte enable into a 4-bit mux select for the 16:1 multiplexer. Alternatively, the four-bit multiplexer select may be input directly to the circuit and may arise from an external processor. The 16:1 multiplexer selects one of the 16 CRC32 values (CRC32R8-CRC32R128) to be loaded into the CRC register. The final CRC32 result is inverted and output in serial or parallel form.

A variety of CRC polynomials may be used with the current invention. Certain data communications formats, such as Ethernet, use a predetermined CRC polynomial that has proven to be highly effective in detecting data integrity errors. For Ethernet, hexadecimal 04C11DB7 may be used. The CRC polynomials may be implemented in various ways. The following equations may be used and are preferably implemented in hardware:

Initialization:

***SHIFT-1 (size: 32 regs)***
r0_reg[0] (xor=1 depth=1): crc_reg[0]
r0_reg[1] (xor=1 depth=1): crc_reg[1]
r0_reg[2] (xor=1 depth=1): crc_reg[2]
r0_reg[3] (xor=0 depth=1): crc_reg[3]
r0_reg[4] (xor=1 depth=1): crc_reg[4]
r0_reg[5] (xor=1 depth=1): crc_reg[5]
r0_reg[6] (xor=0 depth=1): crc_reg[6]
r0_reg[7] (xor=1 depth=1): crc_reg[7]
r0_reg[8] (xor=1 depth=1): crc_reg[8]
r0_reg[9] (xor=0 depth=1): crc_reg[9]
r0_reg[10] (xor=1 depth=1): crc_reg[10]
r0_reg[11] (xor=1 depth=1): crc_reg[11]
r0_reg[12] (xor=1 depth=1): crc_reg[12]
r0_reg[13] (xor=0 depth=1): crc_reg[13]
r0_reg[14] (xor=0 depth=1): crc_reg[14]
r0_reg[15] (xor=0 depth=1): crc_reg[15]
r0_reg[16] (xor=1 depth=1): crc_reg[16]
r0_reg[17] (xor=0 depth=1): crc_reg[17]
r0_reg[18] (xor=0 depth=1): crc_reg[18]
r0_reg[19] (xor=0 depth=1): crc_reg[19]
r0_reg[20] (xor=0 depth=1): crc_reg[20]
r0_reg[21] (xor=0 depth=1): crc_reg[21]
r0_reg[22] (xor=1 depth=1): crc_reg[22]
r0_reg[23] (xor=1 depth=1): crc_reg[23]
r0_reg[24] (xor=0 depth=1): crc_reg[24]
r0_reg[25] (xor=0 depth=1): crc_reg[25]
r0_reg[26] (xor=1 depth=1): crc_reg[26]
r0_reg[27] (xor=0 depth=1): crc_reg[27]
r0_reg[28] (xor=0 depth=1): crc_reg[28]
r0_reg[29] (xor=0 depth=1): crc_reg[29]
r0_reg[30] (xor=0 depth=1): crc_reg[30]
r0_reg[31] (xor=0 depth=1): crc_reg[31]

**SHIFT 7 (size: 32 regs)***
r8_reg[0]=crc_reg[24]^crc_reg[30]^din[1]^din[7];
r8_reg[1]=crc_reg[24]^crc_reg[25]^crc_reg[30]^crc_reg[31]^din[0]^din[1]^din[6]^din[7];
r8_reg[2]=crc_reg[24]^crc_reg[25]^crc_reg[26]^crc_reg[30]^crc_reg[31]^din[0]^din[1]^din[5]^din[6]^din[7];
r8_reg[3]=crc_reg[25]^crc_reg[26]^crc_reg[27]^crc_reg[31]^din[0]^din[4]^din[5]^din[6];
r8_reg[4]=crc_reg[24]^crc_reg[26]^crc_reg[27]^crc_reg[28]^crc_reg[30]^din[1]^din[3]^din[4]^din[5]^din[7];
r8_reg[5]=crc_reg[24]^crc_reg[25]^crc_reg[27]^crc_reg[28]^crc_reg[29]^crc_reg[30]^crc_reg[31]^din[0]^din[1]^din[2]^din[3]^din[4]^din[6]^din[7];
r8_reg[6]=crc_reg[25]^crc_reg[26]^crc_reg[28]^crc_reg[29]^crc_reg[30]^crc_reg[31]^din[0]^din[1]^din[2]^din[3]^din[5]^din[6];
r8_reg[7]=crc_reg[24]^crc_reg[26]^crc_reg[27]^crc_reg[29]^crc_reg[31]^din[0]^din[2]^din[4]^din[5]^din[7];
r8_reg[8]=crc_reg[0]^crc_reg[24]^crc_reg[25]^crc_reg[27]^crc_reg[28]^din[3]^din[4]^din[6]^din[7];
r8_reg[9]=crc_reg[1]^crc_reg[25]^crc_reg[26]^crc_reg[28]^crc_reg[29]^din[2]^din[3]^din[5]^din[6];
r8_reg[10]=crc_reg[24]^crc_reg[26]^crc_reg[27]^crc_reg[29]^crc_reg[2]^din[2]^din[4]^din[5]^din[7];
r8_reg[11]=crc_reg[24]^crc_reg[25]^crc_reg[27]^crc_reg[28]^crc_reg[3]^din[3]^din[4]^din[6]^din[7];

r8_reg[12]=crc_reg[24]^crc_reg[25]^crc_reg[26]^crc_reg[28]^crc_reg[29]^crc_reg[30]^crc_reg[4]^din[1]^din[2]^din[3]^din[5]^din[6]^din[7];

r8_reg[13]=crc_reg[25]^crc_reg[26]^crc_reg[27]^crc_reg[29]^crc_reg[30]^crc_reg[31]^crc_reg[5]^din[0]^din[1]^din[2]^din[4]^din[5]^din[6];

r8_reg[14]=crc_reg[26]^crc_reg[27]^crc_reg[28]^crc_reg[30]^crc_reg[31]^crc_reg[6]^din[0]^din[1]^din[3]^din[4]^din[5];

r8_reg[15]=crc_reg[27]^crc_reg[28]^crc_reg[29]^crc_reg[31]^crc_reg[7]^din[0]^din[2]^din[3]^din[4];

r8_reg[16]=crc_reg[24]^crc_reg[28]^crc_reg[29]^crc_reg[8]^din[2]^din[3]^din[7];

r8_reg[17]=crc_reg[25]^crc_reg[29]^crc_reg[30]^crc_reg[9]^din[1]^din[2]^din[6];

r8_reg[18]=crc_reg[10]^crc_reg[26]^crc_reg[30]^crc_reg[31]^din[0]^din[1]^din[5];

r8_reg[19]=crc_reg[11]^crc_reg[27]^crc_reg[31]^din[0]^din[4];

r8_reg[20]=crc_reg[12]^crc_reg[28]^din[3];

r8_reg[21]=crc_reg[13]^crc_reg[29]^din[2];

r8_reg[22]=crc_reg[14]^crc_reg[24]^din[7];

r8_reg[23]=crc_reg[15]^crc_reg[24]^crc_reg[25]^crc_reg[30]^din[1]^din[6]^din[7];

r8_reg[24]=crc_reg[16]^crc_reg[25]^crc_reg[26]^crc_reg[31]^din[0]^din[5]^din[6];

r8_reg[25]=crc_reg[17]^crc_reg[26]^crc_reg[27]^din[4]^din[5];

r8_reg[26]=crc_reg[18]^crc_reg[24]^crc_reg[27]^crc_reg[28]^crc_reg[30]^din[1]^din[3]^din[4]^din[7];

r8_reg[27]=crc_reg[19]^crc_reg[25]^crc_reg[28]^crc_reg[29]^crc_reg[31]^din[0]^din[2]^din[3]^din[6];

r8_reg[28]=crc_reg[20]^crc_reg[26]^crc_reg[29]^crc_reg[30]^din[1]^din[2]^din[5];

r8_reg[29]=crc_reg[21]^crc_reg[27]^crc_reg[30]^crc_reg[31]^din[0]^din[1]^din[4];

r8_reg[30]=crc_reg[22]^crc_reg[28]^crc_reg[31]^din[0]^din[3];

r8_reg[31]=crc_reg[23]^crc_reg[29]^din[2];

The present invention may be implemented in various ways. Preferably, the CRC output value is updated every clock cycle, but other arrangements may be employed. For example, the CRC output value may be updated every other clock cycle or every third clock cycle. The CRC polynomial may be changed by reconfiguring the hardware or reloading a storage device, such as a register, with the CRC polynomial.

It is believed that the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages, the form hereinbefore described being merely an explanatory embodiment thereof. It is the intention of the following claims to encompass and include such changes.

What is claimed is:

1. A circuit for performing n-bit cyclic redundancy check (CRC) calculations, comprising:
 a plurality of CRC calculation blocks, each of the plurality of CRC calculation blocks performing a CRC calculation in parallel to yield a plurality of CRC calculation values of an n-bit CRC result;
 a switch configured for selectively passing one CRC calculation value included in the plurality of CRC calculation values, the passed CRC calculation value being calculated by one of said plurality of CRC calculation blocks; and
 a CRC register for latching the one of the CRC calculation values selectively passed by the switch, wherein the latched CRC calculation value is inverted.

2. The circuit of claim 1, wherein the latched CRC calculation value is fedback to the plurality of CRC calculation blocks.

3. The circuit of claim 1, wherein the plurality of CRC calculation blocks receives a data input.

4. The circuit of claim 3, wherein the data input is in the form of one or more eight bit bytes.

5. The circuit of claim 4, wherein each of the plurality of CRC calculation blocks receives a different number of eight bit bytes from the data input.

6. The circuit of claim 4, wherein each of the plurality of CRC calculation blocks use a 32 bit CRC polynomial.

7. The circuit of claim 6, wherein each of the plurality of CRC calculation blocks uses the same 32 bit CRC polynomial.

8. The circuit of claim 7, wherein the 32 bit CRC polynomial is for Ethernet.

9. The circuit of claim 4, wherein there are sixteen CRC calculation blocks including the first and second CRC calculation blocks.

10. The circuit of claim 1, wherein the circuit is implemented as a field programmable gate array.

11. The circuit of claim 6, wherein the 32 bit polynomial is loadable into the circuit.

12. The circuit of claim 6, wherein the 32 bit polynomial is built into the circuit.

13. A method for calculating a cyclic redundancy check (CRC) value with a variable width data input, comprising:
 Inputting a variable width data word;
 Calculating a first CRC value having a first number of bits using the variable width data word;
 Calculating a second CRC value having a second number of bits using the variable width data word, wherein the first and second CRC value calculations occur in parallel; and
 Selecting one of: the first and the second CRC value as the CRC output value wherein the selection of one of: the first value and the second CRC value is accomplished by a switch selection signal, wherein the switch selection signal is a multi-bit value, wherein the multi-bit value is decoded to provide a four bit value to a mux that performs the selection of the one of the first and second CRC values, wherein a CRC output value is latched after being output by the mux and the latched CRC output value is feedback, wherein the CRC output value is inverted.

14. The method of claim 13, wherein the variable width data word is 32 bits long.

15. The method of claim 13, wherein the second CRC value is calculated using a portion of the variable width data word that is not used in the calculation of the first CRC value.

16. The method of claim 15, wherein the second CRC value is calculated using a portion of the variable width data word that is used in the calculation of the first CRC value.

17. The method of claim 13 further comprising feeding back the CRC output value as an input for the calculation of the first and second CRC values.

* * * * *